(12) United States Patent
Yong

(10) Patent No.: US 10,911,048 B1
(45) Date of Patent: Feb. 2, 2021

(54) DYNAMICALLY ADJUSTABLE CMOS CIRCUIT

(71) Applicant: NuVia Inc., Santa Clara, CA (US)

(72) Inventor: John Yong, Santa Clara, CA (US)

(73) Assignee: Nuvia Inc., Santa Clara, CA (US)

( * ) Notice: Subject to any disclaimer, the term of this patent is extended or adjusted under 35 U.S.C. 154(b) by 0 days.

(21) Appl. No.: 16/867,301

(22) Filed: May 5, 2020

Related U.S. Application Data

(60) Provisional application No. 62/952,579, filed on Dec. 23, 2019.

(51) Int. Cl.
*H03K 19/0175* (2006.01)
*H03K 19/0185* (2006.01)
*H03K 17/687* (2006.01)
*H01L 27/092* (2006.01)

(52) U.S. Cl.
CPC ... *H03K 19/018521* (2013.01); *H01L 27/092* (2013.01); *H03K 17/6872* (2013.01)

(58) Field of Classification Search
CPC .............. H01L 27/092; H03K 17/6872; H03K 19/0027; H03K 19/018521; H03K 19/018535; H03K 19/018571
See application file for complete search history.

(56) References Cited

U.S. PATENT DOCUMENTS

| 7,538,572 | B2 * | 5/2009 | Lee | H03K 19/01721 |
| | | | | 326/26 |
| 7,969,197 | B2 * | 6/2011 | Muraoka | H03K 19/018521 |
| | | | | 326/86 |
| 2003/0193351 | A1 * | 10/2003 | Fukui | H03K 19/01721 |
| | | | | 326/83 |
| 2013/0207687 | A1 * | 8/2013 | Honda | H03K 19/018521 |
| | | | | 326/30 |

* cited by examiner

*Primary Examiner* — Kurtis R Bahr
(74) *Attorney, Agent, or Firm* — Martensen IP

(57) ABSTRACT

A complementary metal-oxide semiconductor (CMOS) circuit comprises an inverter, a plurality of P-type metal-oxide semiconductor (PMOS) transistors, and a plurality of N-type metal-oxide semiconductor (NMOS) transistors. The inverter receives an input signal and drives one of the plurality of PMOS transistors or the plurality of NMOS transistors. The plurality of PMOS transistors generate a pull-up signal, change a beta ratio of the CMOS circuit, and change a first trip point of the CMOS circuit to a second trip point of the CMOS circuit based on the changed beta ratio. The plurality of NMOS transistors generate a pull-down signal, change the beta ratio, and change the second trip point of the CMOS circuit to a third trip point of the CMOS circuit based on the changed beta ratio.

22 Claims, 5 Drawing Sheets

202

| Input (A) 204 | Input (Ā) 206 | Mode 208 | Mode 210 | Output 212 |
|---|---|---|---|---|
| 0 | 1 | ON | OFF | 1 |
| 1 | 0 | ON | OFF | 1 |

| Input (A) 204 | Input (Ā) 206 | Mode 216 | Mode 218 | Output 220 |
|---|---|---|---|---|
| 0 | 1 | OFF | ON | 0 |
| 1 | 0 | OFF | ON | 0 |

FIG. 2C

DYNAMICALLY ADJUSTABLE CMOS CIRCUIT

TECHNOLOGICAL FIELD

An example embodiment of the present invention generally relates to integrated circuits, and more particularly relates to dynamically adjustable complementary metal oxide semiconductor (CMOS) circuits.

BACKGROUND

Many digital logic circuits are implemented in complementary metal-oxide-semiconductors (CMOS). The CMOS is a type of metal-oxide semiconductor field-effect transistor (MOSFET) fabrication process that uses complementary and symmetrical pairs of transistors (such as a P-type MOSFETs and N-type MOSFETs) for logic functions. CMOS circuits are manufactured in high quantities and offer high operating speed, energy efficiency and a high degree of noise immunity relative to bipolar transistor-based ICs. CMOS technology is found in microprocessors, microcontrollers, memory chips (including CMOS BIOS), and other digital logic circuits. The CMOS technology is also used for analog circuits such as image sensors (CMOS sensors), data converters, RF circuits (RF CMOS), and highly integrated transceivers for many types of communication.

In the CMOS circuits, output voltage switches between a high state and a low state based on an input voltage. The output voltage switches from the high state to the low state or from the low state to the high state based on threshold voltage levels (also known as trip points). The trip point for the P-type MOSFET (PMOS) corresponds to a low input voltage level (VII) and the trip point for the N-type MOSFET (NMOS) corresponds to a high input voltage level (Val). Consequently, in the CMOS circuit, the PMOS is turned ON and the NMOS is turned OFF when the input voltage is less than or equal to the $V_{IL}$, and the PMOS is turned OFF and the NMOS is turned ON when the input voltage is greater than or equal to the $V_{IH}$. Due to wider application area of the CMOS circuits, a high performance level of the CMOS circuits, such as faster response time, faster switching from one state to another state (i.e. the low state to the high state or vice-versa), low heat dissipation, and the like, is always desired.

Typically, the performance of the CMOS circuits depends on a number of factors, such as the trip points, design parameters (Beta ratio), and the like. Generally, these factors are controlled while manufacturing and designing the CMOS circuits in order to optimize performance of the CMOS circuits. However, in real-time operation of such CMOS circuits, these factors remain constant and are not adjustable in case of change in operating conditions for the CMOS circuits. Accordingly, undesirable output is generated by the CMOS circuits, which leads to failure of operations in the circuits or devices including such CMOS circuits.

BRIEF SUMMARY

Accordingly, there is a need of a dynamically adjustable CMOS circuit, thereby leading to development of an optimized CMOS circuit that can be used for providing high speed operations in the devices and circuits.

A dynamically adjustable CMOS circuit and a method for adjusting trip points of a CMOS circuit are provided in accordance with an example embodiment described herein.

Some example embodiments disclosed herein provide a complementary metal-oxide semiconductor (CMOS) circuit comprising a first inverter, a plurality of P-type metal-oxide semiconductor (PMOS) transistors, and a plurality of N-type metal-oxide semiconductor (NMOS) transistors. The first inverter is configured to receive an input signal and drive one of the plurality of PMOS transistors or the plurality of NMOS transistors, based on the received input. The plurality of PMOS transistors are configured to generate a pull-up signal, change a beta ratio of the CMOS circuit from a first value to a second value based on the generated pull-up signal, and change a first trip point of the CMOS circuit to a second trip point of the CMOS circuit, based on the second value of the beta ratio. Further, the plurality of NMOS transistors are configured to generate a pull-down signal, change the beta ratio from the second value to a third value based on the generated pull-down signal, and change the second trip point of the CMOS circuit to a third trip point of the CMOS circuit, based on the third value of the beta ratio.

According to some example embodiments, a gate terminal of each of a first PMOS transistor and a second PMOS transistor of the plurality of PMOS transistors is connected to an input terminal of the first inverter.

According to some example embodiments, a gate terminal of a third PMOS transistor of the plurality of PMOS transistors is connected to an output terminal of the first inverter.

According to some example embodiments, a gate terminal of each of a first NMOS transistor and a second NMOS transistor of the plurality of PMOS transistors is connected to the input terminal of the first inverter.

According to some example embodiments, wherein a gate terminal of a third NMOS transistor of the plurality of NMOS transistors is connected to the output terminal of the first inverter.

According to some example embodiments, each of the first trip point, the second trip point, and the third trip point of the CMOS circuit is associated with a corresponding threshold voltage level.

According to some example embodiments, the first inverter is a Schmitt trigger.

According to some example embodiments, the CMOS circuit further comprises a second inverter configured to output a feedback signal to the input terminal of the first inverter.

According to some example embodiments, the second inverter is connected to a drain terminal of each of the first PMOS transistor, the second PMOS transistor, the first NMOS transistor, and the second NMOS transistor.

According to some example embodiments, a drain terminal of the first PMOS transistor is connected to a first source voltage and a source terminal of the third PMOS transistor is connected to a second source voltage.

According to some example embodiments, a source terminal of the second PMOS transistor is connected to a drain terminal of the third transistor.

According to some example embodiments, a source terminal of the first NMOS transistor is connected to ground and a source terminal of the second NMOS transistor is connected to the ground.

According to some example embodiments, a drain terminal of the second NMOS transistor is connected to a source terminal of the third NMOS transistor.

According to some example embodiments, the first PMOS transistor is a network of pull-up PMOS transistors, and wherein the first NMOS transistor is a network of pull-down NMOS transistors.

According to some example embodiments, the second PMOS transistor is configured to execute a skew-rise operation.

According to some example embodiments, the second NMOS transistor is configured to execute a skew-fall operation.

In some example embodiments, a method for adjusting trip points of a complementary metal-oxide semiconductor (CMOS) circuit may be provided. The method comprises receiving an input signal and generating one of a pull-up signal or a pull-down signal based on the input signal. The method further comprises changing a beta ratio of the CMOS circuit from a first value to a second value, based on the generated one of the pull-up signal or the pull-down signal. The method further comprises changing a first trip point of the CMOS circuit to a second trip point of the CMOS circuit, based on the second value of the beta ratio.

BRIEF DESCRIPTION OF THE DRAWINGS

Figure 1:
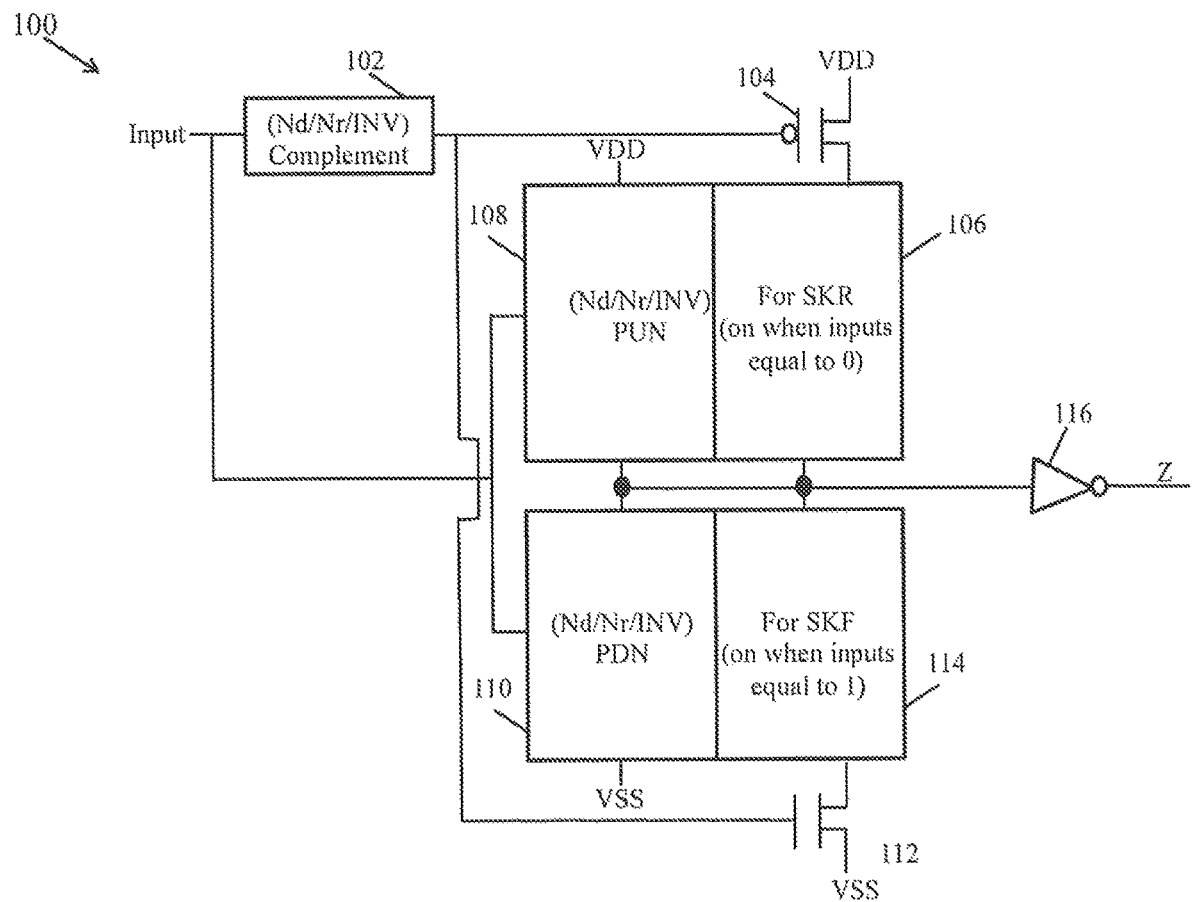
Figure 2A:
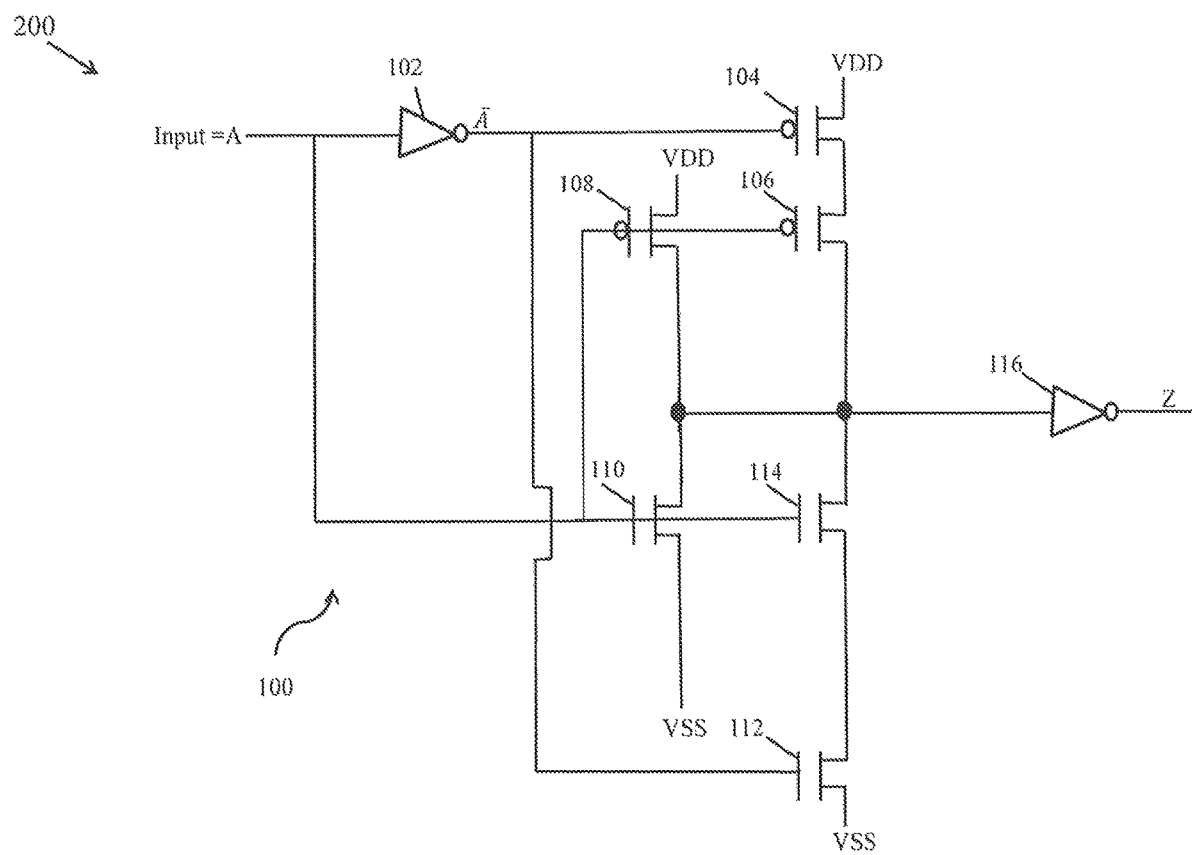
Figure 3:
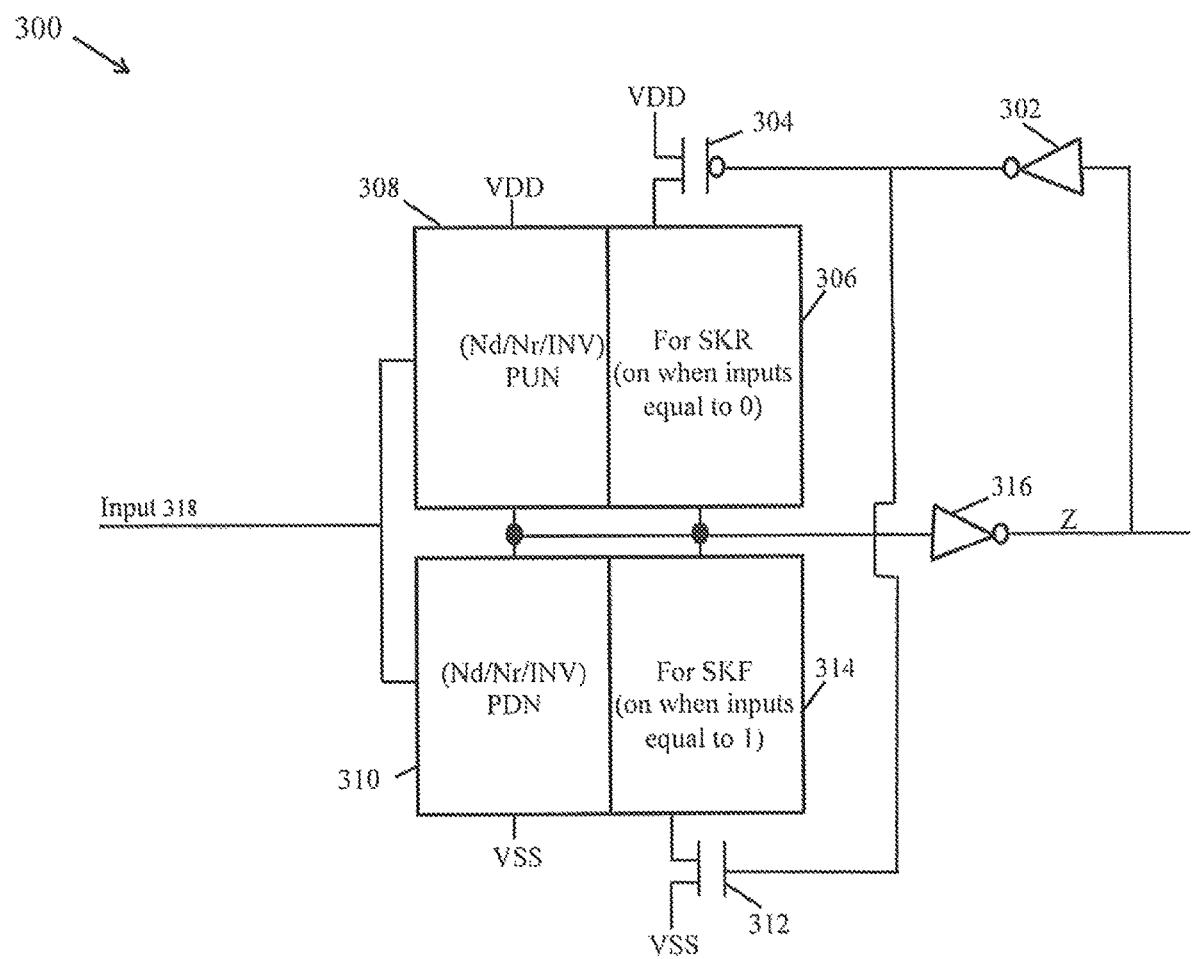
Figure 4:
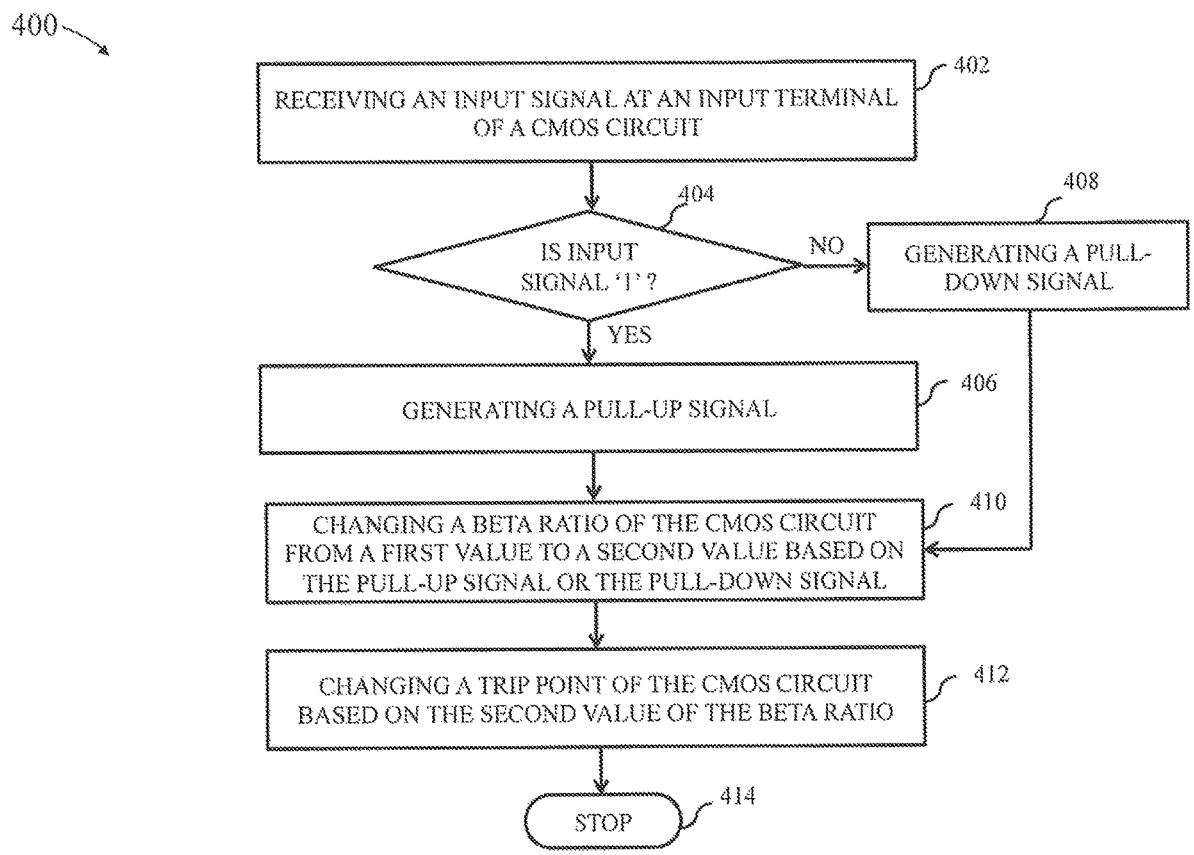

Having thus described example embodiments of the invention in general terms, reference will now be made to the accompanying drawings, which are not necessarily drawn to scale, and wherein:

FIG. 1 illustrates a schematic of a CMOS circuit, in accordance with an example embodiment;

FIG. 2A illustrates a circuit diagram of the CMOS circuit, in accordance with an embodiment;

FIG. 2B illustrates a working table for NAND gate operations of the CMOS circuit, in accordance with an embodiment;

FIG. 2C illustrates a working table for NOR gate operations of the CMOS circuit, in accordance with an embodiment;

FIG. 3 illustrates a block diagram of a modified CMOS circuit, in accordance with an embodiment; and FIG. 4 illustrates a flowchart for implementation of an exemplary method 400 for adjusting trip points in the CMOS circuit, in accordance with an embodiment.

DETAILED DESCRIPTION

In the following description, for purposes of explanation, numerous specific details are set forth in order to provide a thorough understanding of the present disclosure. It will be apparent, however, to one skilled in the art that the present disclosure can be practiced without these specific details. In other instances, apparatuses and methods are shown in block diagram form only in order to avoid obscuring the present disclosure.

Reference in this specification to "one embodiment" or "an embodiment" means that a particular feature, structure, or characteristic described in connection with the embodiment is included in at least one embodiment of the present disclosure. The appearance of the phrase "in one embodiment" in various places in the specification are not necessarily all referring to the same embodiment, nor are separate or alternative embodiments mutually exclusive of other embodiments. Further, the terms "a" and "an" herein do not denote a limitation of quantity, but rather denote the presence of at least one of the referenced items. Moreover, various features are described which may be exhibited by some embodiments and not by others. Similarly, various requirements are described which may be requirements for some embodiments but not for other embodiments.

Some embodiments of the present invention will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, the terms "input," "input signal," and similar terms may be used interchangeably to refer to data capable of being transmitted, received, input, and/or output in accordance with embodiments of the present invention. Thus, use of any such terms should not be taken to limit the spirit and scope of embodiments of the present invention.

The embodiments are described herein for illustrative purposes and are subject to many variations. It is understood that various omissions and substitutions of equivalents are contemplated as circumstances may suggest or render expedient but are intended to cover the application or implementation without departing from the spirit or the scope of the present disclosure. Further, it is to be understood that the phraseology and terminology employed herein are for the purpose of the description and should not be regarded as limiting. Any heading utilized within this description is for convenience only and has no legal or limiting effect.

A dynamically adjustable CMOS circuit is provided herein in accordance with an example embodiment. In some example embodiments, the CMOS circuit provided herein may also be used for faster switching operations in electronic circuits. The CMOS circuit disclosed herein provides high speed switching between operations being performed in electronic devices and circuits with high accuracy. These and other technical improvements of the invention will become evident from the description provided herein.

FIG. 1 illustrates a schematic of a CMOS circuit 100, in accordance with an example embodiment. The CMOS circuit 100 may include an inverter 102, a plurality of P-type metal-oxide semiconductor field-effect transistors (hereinafter, "PMOS transistors"), a plurality of NMOS transistors, and an inverter 116. As an example, the plurality of PMOS transistors may include a first PMOS transistor 104, a second PMOS transistor 106, and a third PMOS transistor 108. Similarly, in some example embodiments, the plurality of NMOS transistors may include a first NMOS transistor 110, a second NMOS transistor 112, and a third NMOS transistor 114.

In some embodiments, the inverter 102 may be a Schmitt trigger circuit. The Schmitt trigger may be a bi-stable network that may have two threshold voltage levels called as an upper trigger point (UTP) voltage and a lower trigger point (LTP) voltage. Output of the Schmitt trigger may change state in case a positive going input passes the UTP voltage or in case a negative going input passes the LTP voltage. In the CMOS circuit 100, the Schmitt trigger (as the inverter 102) may be utilized to switch the threshold between the plurality of PMOS transistors and the plurality of NMOS transistors.

Some embodiments may be based on a realization that an NMOS transistor may output a strong '0' and a weak '1', and a PMOS transistor may output a strong '1' and a weak '0'. In accordance with such a realization, the PMOS transistor 108 may be a pull-up network configured to provide a low resistance path to a source voltage when output is logic '1' and a high resistance path otherwise. The NMOS 110 transistor may a pull-down network be configured to provide a low resistance path to ground when the output is logic '0' and a high resistance path otherwise.

As shown in FIG. 1, in the CMOS circuit 100, a source terminal of each of the first PMOS transistor 104 and the third PMOS transistor 108 may be connected to a supply voltage (i.e., VDD). Further, a drain terminal of the first PMOS transistor 104 may be connected to a source terminal of the PMOS transistor 106. A source terminal of each of the second NMOS transistor 112 and the first NMOS transistor 110 may be connected to ground (i.e., VSS). Further, a source terminal of the third NMOS transistor 114 may be connected to a drain terminal of the second NMOS transistor 112.

In some embodiments, a gate terminal of each of the second PMOS transistor 106, the third PMOS transistor 108, the first NMOS transistor 110, and the third NMOS transistor 114 may be connected to an input terminal of the inverter 102. Further, a gate terminal of each of the first PMOS transistor 104 and the second NMOS transistor 112 may be connected to an output terminal of the inverter 102.

In accordance with an embodiment, a drain terminal of each of the second PMOS transistor 106, the third PMOS transistor 108, the first NMOS transistor 110, and the third NMOS transistor 114 may be connected to an input terminal of an inverter 116. Further, the input terminal of the inverter 102 may correspond to an input terminal of the CMOS circuit 100 and an output terminal of the inverter 116 may correspond to a feedback terminal of the CMOS circuit 100.

In operation, when an input signal (i.e., an input) is provided to an input terminal of the inverter 102 (i.e., the input terminal of the CMOS circuit 100), an inverted signal from the output terminal of the inverter 102 may be provided to each of the gate terminal of the first PMOS transistor 104 and the gate terminal of the second NMOS transistor 112. Further, the input signal from the input terminal of the inverter 102 may be provided to the gate terminal of each of the second PMOS transistor 106, the third PMOS transistor 108, the first NMOS transistor 110, and the third NMOS transistor 114.

In accordance with respective input signal at each of the first PMOS transistor 104, the second PMOS transistor 106, the third PMOS transistor 108, the first NMOS transistor 110, the second NMOS transistor 112, and the third NMOS transistor 114, a beta ratio (i.e., β ratio) of the CMOS circuit 100 may be changed. The β ratio may correspond to a ratio between an effective pull-up of the plurality of PMOS transistors and an effective pull-down of the plurality of NMOS transistors in the CMOS circuit 100. The effective pull-up of the plurality of PMOS transistors in the CMOS circuit 100 may correspond to an equivalent pull-up obtained by addition of output generated at the drain terminal of each of the first PMOS transistor 104, the second PMOS transistor 106, and the third PMOS transistor 108. Further, the effective pull-down of the plurality of NMOS transistors in the CMOS circuit 100 may correspond to an equivalent pull-down obtained by addition of output generated at the drain terminal of each of the first NMOS transistor 110, the second NMOS transistor 112, and the third NMOS transistor 114.

Some embodiments may be based on a realization that the CMOS circuit 100 may be un-skewed in case the β ratio=1. In a case where the β ratio is changed, the CMOS circuit 100 may operate as a skewed CMOS circuit.

In case the β ratio is greater than 1, the CMOS circuit 100 may operate as a high-skewed (HI-skewed) CMOS circuit. In the HI-skewed CMOS circuit, the plurality of PMOS transistors in the CMOS circuit 100 may be stronger than the plurality of NMOS transistors in the CMOS circuit 100. In such a case, if an input to the HI-skewed CMOS circuit is VDD/2, an output generated by the plurality of PMOS transistors may be greater than the VDD/2. In other words, an input threshold of each of the plurality of PMOS transistors in may be higher than for the un-skewed CMOS circuit.

In case the β ratio is less than 1, the CMOS circuit 100 may operate as a low-skewed (LO-skewed) CMOS circuit. In such a case, the plurality of NMOS transistors of the CMOS circuit 100 in the HI-skewed CMOS circuit may be stronger than the plurality of PMOS transistors of the CMOS circuit 100. Accordingly, in the LO-skewed CMOS circuit, an input threshold voltage for each of the plurality of NMOS transistors may be higher than for the un-skewed CMOS circuit.

Further, some embodiments may be based on a realization that due to change in the β ratio, one of a skew rise operation or a skew fall operation may be executed in a faster manner by the CMOS circuit 100 as one of the HI-skewed CMOS circuit or the LO-skewed CMOS circuit. To that end, one of the plurality of PMOS transistors or the plurality of NMOS transistors in the CMOS circuit 100 may be activated and the other one may be deactivated based on received input at respective gate terminals.

More specifically, the second PMOS transistor 106 in the CMOS circuit 100 may be configured to execute the skew rise operation based on an input '0'. Alternatively, the third NMOS transistor 114 in the CMOS circuit 100 may be configured to execute the skew fall operation based on an input '1'. For instance, if the β ratio is greater than 1, the skew rise operation may be executed by the second PMOS transistor 106 having an input equal to "0". If the β ratio is less than 1, the skew fall operation may be executed by the NMOS transistor 114 having an input equal to "1".

In accordance with an embodiment, the change in the β ratio may provide a faster transition in the previous state of the CMOS circuit 100 from '0' to '1' or vice-versa. To that end, one of the plurality of P-type transistors or the plurality of N-type transistors may be activated in accordance with the received input. A detailed working of the CMOS circuit 100 is described next with reference to FIGS. 2A, 2B, and 2C.

FIG. 2A, FIG. 2B, and FIG. 2C, collectively describe operation of the CMOS circuit 100, in accordance with one embodiment.

FIG. 2A illustrates a circuit diagram 200 of the CMOS circuit 100, in accordance with an embodiment. FIG. 2A is explained in conjunction with FIG. 1. In FIG. 2A, there is shown connections among the plurality of PMOS transistors and the plurality of NMOS transistors in the CMOS circuit 100. The third PMOS transistor 108 may be connected in parallel with the second PMOS transistor 106 and the first PMOS transistor 104. The first PMOS transistor 104 may be connected in series with the second PMOS transistor 106. Further, the first NMOS transistor 110 may be connected in parallel with the third NMOS transistor 114 and the second NMOS transistor 112. The second NMOS transistor 112 may be connected in series with the third NMOS transistor 114.

FIG. 2B illustrates a working table 202 for NAND gate operations of the CMOS circuit 100, in accordance with an embodiment. The table 202 may include an input (A) 204 (at the input terminal of the inverter 102) and an input (A) 206 (at the plurality of PMOS transistors and the plurality of NMOS transistors, a mode 208 of the plurality of PMOS transistors, a mode 210 of the plurality of NMOS transistors, and an output 212.

The CMOS circuit 100 may be configured to execute the NAND gate operations, if PMOS transistors in the plurality of PMOS transistors in the CMOS circuit 100 are connected in parallel or NMOS transistors in the plurality of NMOS transistors in the CMOS circuit 100 are connected in series. As shown in table 202, the mode 208 of the third PMOS transistor 108 may be 'ON' in case the input (A) is either '1' or '0'. More specifically, the PMOS transistors in the plurality of PMOS transistors connected in series in the CMOS circuit 100 may be activated in the NAND gate operations of the CMOS circuit 100 along with the input (A) either '0' or '1'. In such a case, the output of the mode 208 may always be '1' (i.e., a pull-up signal). Further, the mode 210 of the first NMOS transistor 110 may be 'OFF' in case the input (A) is either '1' or '0'.

FIG. 2C illustrates a working table 214 for NOR gate operations of the CMOS circuit 100, in accordance with an embodiment. FIG. 2C is explained in conjunction with elements from FIG. 2B. The table 214 may include the input (A) 204 and the input (A) 206, a mode 216 of the plurality of PMOS transistors, a mode 218 of the plurality of NMOS transistors, and an output 220.

The CMOS circuit 100 may be configured to execute the NOR gate operations, if PMOS transistors in the plurality of PMOS transistors in the CMOS circuit 100 are connected in series or NMOS transistors in the plurality of NMOS transistors in the CMOS circuit 100 are connected in parallel. As shown in table 214, the mode 218 of the plurality of NMOS transistors may be 'ON' in case the input (A) is either '1' or '0'. More specifically, the NMOS transistors in the plurality of NMOS transistors connected in series in the CMOS circuit 100 may be activated in the NOR gate operations of the CMOS circuit 100 along with the input (A) either '0' or '1'. In such a case, the output of the mode 218 may always be '0' (i.e., a pull-down signal). Further, the Mode 216 of the plurality of PMOS transistors may be 'OFF' in case the input (A) is either '1' or '0'.

Further, some embodiments may be based on a realization that the plurality of PMOS transistors (i.e., the first PMOS transistor 104, the second PMOS transistor 106, and the third PMOS transistor 108) may be activated when an input at respective gate terminals may be '0' and the plurality of NMOS transistors (i.e., the first NMOS transistor 110, the second NMOS transistor 112, and the third NMOS transistor 114) may be activated when an input at the respective gate terminals may be '1'. Accordingly, the first PMOS transistor 104 may be activated and the second NMOS transistor 112 may be deactivated based on the received input '0' at the respective gate terminals. More specifically, the first PMOS transistor 104 may be on and the second NMOS transistor 112 may be off based on the received input '0'. In case each of the third PMOS transistor 108 and the first NMOS transistor 110 receives the input '1' from the input terminal of the inverter 102, the NMOS transistor 110 may be activated and the third PMOS transistor 108 may be deactivated.

In accordance with an embodiment, based on the series and the parallel connections among the plurality of PMOS transistors and the plurality of NMOS transistors in the CMOS circuit 100 and the respective inputs, each of the first PMOS transistor 104, the second PMOS transistor 106, the third PMOS transistor 108, the first NMOS transistor 110, the second NMOS transistor 112, and the third NMOS transistor 114 may be configured to execute the NAND gate operations and the NOR gate operations. To that end, an input signal (A) may be provided at an input terminal of the inverter 102.

For instance, the input signal (A) at the input terminal of the inverter 102 may be '1', then the inverter 102 may output an inverted signal (A) (i.e., '0') at the output terminal of the inverter 102. Accordingly, '0' may be provided to the gate terminal of each of the first PMOS transistor 104 and the second NMOS transistor 112, and hence the first PMOS transistor 104 may be activated and the second NMOS transistor 112 may be deactivated. Further, the gate terminal of each of the second PMOS transistor 106, the third PMOS transistor 108, the first NMOS transistor 110, and the third PMOS transistor 114 may receive '1' as an input from the input terminal of the inverter 102. Accordingly, each of the second PMOS transistor 106 and the third PMOS transistor 108 may be deactivated and each of the first NMOS transistor 110 and the third NMOS transistor 114 may be activated. As shown in FIG. 1, the first PMOS transistor 104 may be connected in series with the second PMOS transistor 106, and the third PMOS transistor 108 may be connected in parallel with the first PMOS transistor 104 and the second PMOS transistor 106. With reference to the working table 202 and the working table 214, each of the first PMOS transistor 104, the second PMOS transistor 106, and the third PMOS transistor 108 may generate a pull-up signal (i.e., '1') based on the respective inputs and the connections. Based on the generated pull-up signal, the β ratio of the CMOS circuit 100 may be changed. More specifically, the β ratio may be increased in accordance with the generation of the pull-up signal.

Some embodiments may be based on a realization that the inverted signal (Ā) may be a delayed version of a previous state of the CMOS circuit 100 that may be changed based on a change in the β ratio of the CMOS circuit 100. For instance, the previous state of the CMOS circuit 100 may '0'. In accordance with the change in the β ratio, the previous state (i.e., '0') of the CMOS circuit 100 may be transitioned into another state (i.e., '1'). Further, the state of the CMOS circuit 100 may remain constant (i.e., '1') until the β ratio is changed in a next input cycle.

Based on the realization that the inverted signal (Ā) may be the delayed version of the current state (i.e., '1') of the CMOS circuit 100, the input signal at the input terminal of the inverter 102 may be '0' such that the inverted signal (Ā) may be '1' in the next input cycle.

In the next input cycle, if an input signal at the input terminal of the inverter 102 corresponds to '0', then '1' may be provided to the gate terminal of each of the first PMOS transistor 104 and the second NMOS 112 and hence the first PMOS transistor 104 may be deactivated and the second NMOS transistor 112 may be activated. Further, the gate terminal of each of the second PMOS transistor 106, the third PMOS transistor 108, the first NMOS transistor 110, and the third NMOS transistor 114 may receive '0' as an input from the input terminal of the inverter 102. With reference to the working table 202 and the working table 214, each of the second NMOS transistor 112, the third NMOS transistor 114, and the first NMOS transistor 110 may generate a pull-down signal (i.e., '0') based on the respective inputs and the connections. Accordingly, the β ratio may be changed based on the generated pull-down signal.

Based on the realization that the previous state of the CMOS circuit 100 may be '1', such previous state (i.e., '1') of the CMOS circuit 100 may be transitioned into another state (i.e., '0') quickly based on the changed β ratio. Accordingly, the previous state of the CMOS circuit 100 may be '0' until an input signal is received at the input terminal of the inverter 102 in next input cycle. Therefore, the β ratio of CMOS circuit 100 may be changed in each input cycle which may change the previous state of CMOS circuit 100.

Based on the change in the previous state of the CMOS circuit 100, one of the third PMOS transistor 108 or the first NMOS transistor 110 may be activated and the other may be deactivated. Based on the activation and deactivation of the third PMOS transistor 108 and the first NMOS transistor 110, the β ratio may be changed.

Some embodiments may be based on a realization that trip points in the CMOS circuit 100 may be changed based on the activation of one of the plurality of PMOS transistors and deactivation of the other one. More specifically, the trip points may be changed based on the generation of the pull-up signal or the pull-down signal. The trip points may be input threshold voltage levels in the CMOS circuit 100 to switch output voltage from low to high or high to low. In other words, the trip points may be input threshold levels to switch output from "1" to "0" or vice-versa. Input gate voltages (also called as input threshold voltage levels) of the plurality of PMOS transistors and the NMOS transistors in the CMOS circuit 100 may increase based on the generation of the pull-up signal and the pull-down signal by changing the β ratio. In other words, the trip points of the CMOS circuit may be changed based on the change in the β ratio in the CMOS circuit 100.

Further, the skew rise operation and skew fall operation may be executed in the CMOS circuit. Based on the realization that the β ratio may increase (β ratio>1) in accordance with the generated pull-up signal, the trip point for the plurality of PMOS transistors may be changed such that the skew rise operation may be executed by the second PMOS transistor 106. In the skew rise operation, an input signal (i.e., "0") at the gate terminal of the second PMOS transistor 106 transistor may rise early. Alternatively, based on the realization that the β ratio may decrease (β ratio<1) in accordance with the pull-down signal, the trip point for the plurality of NMOS transistors may be changed such that the skew fall operation may be executed by the third NMOS transistor 114. In the skew fall operation, an input signal (i.e., "1") at the gate terminal of the third NMOS transistor 114 may fall early.

Accordingly, the input signal may rise and fall early by dynamically adjusting the trip points of the CMOS circuit 100 in accordance with the change in the β ratio. Therefore, the CMOS circuit 100 facilitates faster switching operations by early rising or falling the input signal.

FIG. 3 illustrates a block diagram of a modified CMOS circuit 300, in accordance with an embodiment. FIG. 3 is explained in conjunction with elements from FIG. 1, FIG. 2A, FIG. 2B, and FIG. 2C. In FIG. 3, there is shown an inverter 302 that may correspond to the inverter 102. Further, there is shown a PMOS transistor 304, a pull-up PMOS network 306, a PMOS transistor 308, a pull-down NMOS network 310, an NMOS transistor 312, and an NMOS transistor 314. The PMOS transistor 304, the PMOS transistor 306, the PMOS transistor 308, the pull-down NMOS network 310, the NMOS transistor 312, and the NMOS transistor 314 may correspond to the first PMOS transistor 104, the second PMOS transistor 106, the third PMOS transistor 108, the first NMOS transistor 110, the second NMOS transistor 112, and the third NMOS transistor 114, respectively. Each gate terminal of the PMOS transistor 304 and the NMOS transistor 314 may be connected to an output terminal of the inverter 302.

Further, each gate terminal of the PMOS transistor 306, the pull-up PMOS network 308, the pull-down NMOS network 310 and the NMOS transistor 314 may be connected to an input line (i.e. an input 318). There is further shown an inverter 316 (i.e., a feedback terminal of the CMOS circuit 300), where an input terminal of the inverter 316 is connected to a drain terminal of each of the PMOS transistor 306, the pull-up PMOS network 308, the pull-down NMOS network 310, and the NMOS transistor 314. Further, an output terminal of the inverter 316 is connected to an input terminal of the inverter 102.

In accordance with an embodiment, the output of the inverter 316 may be received as an input or a feedback signal by the input terminal of the inverter 302 for each of the PMOS transistor 304, the PMOS transistor 306, the NMOS transistor 312, and the NMOS transistor 314. Referring to FIGS. 2A, 2B, and 2C, based on the realization that the inverted signal at the output terminal of the inverter 102 may be the delayed version of the current state of the CMOS circuit 100. Accordingly, in some implementations, the CMOS circuit 300 may include the inverter 302 at an output terminal of the inverter 316 as a feedback loop in order to provide the delayed version of the current state of the CMOS circuit 300 at the output terminal of the inverter 302. The operations performed in the CMOS circuit 300 may be similar to the operations performed in the CMOS 100 as described above in detail in description of FIG. 1, FIG. 2A, FIG. 2B, and FIG. 2C.

FIG. 4 illustrates a flowchart for implementation of an exemplary method 400 for adjusting trip points of the CMOS circuit 100, in accordance with an embodiment. In some embodiments, the method may be implemented in the CMOS circuit 300.

At step 402, the method comprises receiving an input signal at an input terminal of a CMOS circuit. The CMOS circuit 100 may receive the input signal (i.e., "0" or "1") at the input terminal (i.e. the input terminal of the inverter 102) of the CMOS circuit 100. The input signal may be further provided to the plurality of PMOS transistors and the plurality of NMOS transistors in the CMOS circuit 100 as described in description of FIG. 1.

At step 404, the method comprises determining whether the input signal is '1'. The input signal received at the input terminal 102 may be either '0' or '1'. Accordingly, the plurality of PMOS transistors and the plurality of NMOS transistors may operate as described in description of FIG. 1 and FIG. 2A.

At step 406, the method comprises generating a pull-up signal based on the input signal '1'. Based on the determination that the input received at the input terminal of the inverter is '1', the first PMOS transistor 104, the second PMOS transistor 106, and the third PMOS transistor 108 may generate the pull-up signal. The control passes to step 410.

At step 408, the method comprises generating a pull-down signal based on the logic input "0". Based on the determination that the input received at the input terminal of the inverter is '0', the first NMOS transistor 110, the second NMOS 112, and the third NMOS 114 may generate the pull-down signal.

At step 410, the method comprises changing beta (β) ratio of the CMOS circuit 100 from a first value to a second value based on the pull-up signal or the pull-down signal. The β ratio of the CMOS circuit 100 may be increased based on the generated pull-down signal or the β ratio may be decreased based on the generated pull-down signal in each input cycle as described in description of FIG. 2A, FIG. 2B, and FIG. 2C.

At step 412, the method comprises changing trip points of the CMOS circuit based on the changed. The changed state of the CMOS circuit 100 may be output (as a feedback signal) to the input terminal of the inverter 100 to generate an inverted signal as at the output terminal as a delayed version of the current state of the CMOS circuit 100 as described in description of FIG. 3. The control passes to end 414.

Many modifications and other embodiments of the inventions set forth herein will come to mind to one skilled in the art to which these inventions pertain having the benefit of the teachings presented in the foregoing descriptions and the associated drawings. It is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A complementary metal-oxide semiconductor (CMOS) circuit, comprising:
    a first inverter;
    a plurality of P-type metal-oxide semiconductor (PMOS) transistors; and
    a plurality of N-type metal-oxide semiconductor (NMOS) transistors,
    wherein the first inverter is configured to:
        receive an input signal; and
        drive one of the plurality of PMOS transistors or the plurality of NMOS transistors, based on the received input,
    wherein the plurality of PMOS transistors are configured to:
        generate a pull-up signal;
        change a beta ratio of the CMOS circuit from a first value to a second value,
        based on the generated pull-up signal; and
        change a first trip point of the CMOS circuit to a second trip point of the CMOS circuit, based on the second value of the beta ratio, and
    wherein the plurality of NMOS transistors are configured to:
        generate a pull-down signal;
        change the beta ratio from the second value to a third value, based on the generated pull-down signal; and
        change the second trip point of the CMOS circuit to a third trip point of the CMOS circuit, based on the third value of the beta ratio, wherein,
            a gate terminal of each of a first PMOS transistor and a second PMOS transistor of the plurality of PMOS transistors is connected to an input terminal of the first inverter;
            a gate terminal of a third PMOS transistor of the plurality of PMOS transistors is connected to an output terminal of the first inverter; and
            a gate terminal of each of a first NMOS transistor and a second NMOS transistor of the plurality of PMOS transistors is connected to the input terminal of the first inverter; and a second inverter configured to output a feedback signal to the input terminal of the first inverter.

2. The CMOS circuit of claim 1, wherein a gate terminal of a third NMOS transistor of the plurality of NMOS transistors is connected to the output terminal of the first inverter.

3. The CMOS circuit of claim 1, wherein each of the first trip point, the second trip point, and the third trip point of the CMOS circuit is associated with a corresponding threshold voltage level.

4. The CMOS circuit of claim 1, wherein the first inverter is a Schmitt trigger.

5. The CMOS circuit of claim 1, wherein a drain terminal of the first PMOS transistor is connected to a first source voltage and a source terminal of the third PMOS transistor is connected to a second source voltage.

6. The CMOS circuit of claim 1, wherein a source terminal of the second PMOS transistor is connected to a drain terminal of the third PMOS transistor.

7. The CMOS circuit of claim 1, wherein a source terminal of the first NMOS transistor is connected to ground and wherein a source terminal of the second NMOS transistor is connected to the ground.

8. The CMOS circuit of claim 1, wherein a drain terminal of the second NMOS transistor is connected to a source terminal of the third NMOS transistor.

9. The CMOS circuit of claim 1, wherein the first PMOS transistor is a pull-up PMOS transistor, and wherein the first NMOS transistor is a pull-down NMOS transistor.

10. The CMOS circuit of claim 1, wherein the second PMOS transistor is configured to execute a skew-rise operation.

11. The CMOS circuit of claim 1, wherein the second NMOS transistor is configured to execute a skew-fall operation.

12. A complementary metal-oxide semiconductor (CMOS) circuit, comprising:
    a first inverter;
    a plurality of P-type metal-oxide semiconductor (PMOS) transistors; and
    a plurality of N-type metal-oxide semiconductor (NMOS) transistors,
    wherein the first inverter is configured to:
        receive an input signal; and
        drive one of the plurality of PMOS transistors or the plurality of NMOS transistors, based on the received input,
    wherein the plurality of PMOS transistors are configured to:
        generate a pull-up signal;
        change a beta ratio of the CMOS circuit from a first value to a second value,
        based on the generated pull-up signal; and
        change a first trip point of the CMOS circuit to a second trip point of the CMOS circuit, based on the second value of the beta ratio, and
    wherein the plurality of NMOS transistors are configured to:
        generate a pull-down signal;
        change the beta ratio from the second value to a third value, based on the generated pull-down signal; and
        change the second trip point of the CMOS circuit to a third trip point of the CMOS circuit, based on the third value of the beta ratio, wherein, a gate terminal of each of a first PMOS transistor and a second PMOS transistor of the plurality of PMOS transistors is connected to an input terminal of the first inverter;

a gate terminal of a third PMOS transistor of the plurality of PMOS transistors is connected to an output terminal of the first inverter; and a gate terminal of each of a first NMOS transistor and a second NMOS transistor of the plurality of PMOS transistors is connected to the input terminal of the first inverter; and a second inverter configured to output a feedback signal to the input terminal of the first inverter, wherein the second inverter is connected to a drain terminal of each of the first PMOS transistor, the second PMOS transistor, the first NMOS transistor, and the second NMOS transistor.

13. The CMOS circuit of claim 12, wherein a gate terminal of a third NMOS transistor of the plurality of NMOS transistors is connected to the output terminal of the first inverter.

14. The CMOS circuit of claim 12, wherein each of the first trip point, the second trip point, and the third trip point of the CMOS circuit is associated with a corresponding threshold voltage level.

15. The CMOS circuit of claim 12, wherein the first inverter is a Schmitt trigger.

16. The CMOS circuit of claim 12, wherein a drain terminal of the first PMOS transistor is connected to a first source voltage and a source terminal of the third PMOS transistor is connected to a second source voltage.

17. The CMOS circuit of claim 12, wherein a source terminal of the second PMOS transistor is connected to a drain terminal of the third PMOS transistor.

18. The CMOS circuit of claim 12, wherein a source terminal of the first NMOS transistor is connected to ground and wherein a source terminal of the second NMOS transistor is connected to the ground.

19. The CMOS circuit of claim 12, wherein a drain terminal of the second NMOS transistor is connected to a source terminal of the third NMOS transistor.

20. The CMOS circuit of claim 12, wherein the first PMOS transistor is a pull-up PMOS transistor, and wherein the first NMOS transistor is a pull-down NMOS transistor.

21. The CMOS circuit of claim 12, wherein the second PMOS transistor is configured to execute a skew-rise operation.

22. The CMOS circuit of claim 12, wherein the second NMOS transistor is configured to execute a skew-fall operation.

* * * * *

UNITED STATES PATENT AND TRADEMARK OFFICE
CERTIFICATE OF CORRECTION

PATENT NO. : 10,911,048 B1
APPLICATION NO. : 16/867301
DATED : February 2, 2021
INVENTOR(S) : John Yong It is certified that error appears in the above-identified patent and that said Letters Patent is hereby corrected as shown below:

Column 11, Lines 66-67, Claim 1, should read:
NMOS transistors is connected to the input terminal of the first inverter; and Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*